United States Patent
Shibata et al.

(10) Patent No.: US 12,068,375 B2
(45) Date of Patent: Aug. 20, 2024

(54) NITRIDE SEMICONDUCTOR DEVICE

(71) Applicant: Panasonic Corporation, Osaka (JP)

(72) Inventors: Daisuke Shibata, Kyoto (JP); Satoshi Tamura, Osaka (JP); Naohiro Tsurumi, Kyoto (JP)

(73) Assignee: PANASONIC HOLDINGS CORPORATION, Osaka (JP)

( * ) Notice: Subject to any disclaimer, the term of this patent is extended or adjusted under 35 U.S.C. 154(b) by 330 days.

(21) Appl. No.: 17/763,558

(22) PCT Filed: Sep. 25, 2020

(86) PCT No.: PCT/JP2020/036481
§ 371 (c)(1),
(2) Date: Mar. 24, 2022

(87) PCT Pub. No.: WO2021/079686
PCT Pub. Date: Apr. 29, 2021

(65) Prior Publication Data
US 2022/0376055 A1 Nov. 24, 2022

(30) Foreign Application Priority Data
Oct. 24, 2019 (JP) .................. 2019-193095

(51) Int. Cl.
*H01L 29/778* (2006.01)
*H01L 21/8232* (2006.01)
(Continued)

(52) U.S. Cl.
CPC ...... *H01L 29/2003* (2013.01); *H01L 21/8232* (2013.01); *H01L 29/41758* (2013.01);
(Continued)

(58) Field of Classification Search
None
See application file for complete search history.

(56) References Cited

U.S. PATENT DOCUMENTS

2011/0204381 A1* 8/2011 Okada ................. H01L 29/0692
257/E21.403
2016/0329421 A1* 11/2016 Shibata ............... H01L 29/7788
(Continued)

FOREIGN PATENT DOCUMENTS

JP 2011-135094 A 7/2011
JP 2017-147435 A 8/2017
(Continued)

OTHER PUBLICATIONS

International Search Report (ISR) issued on Dec. 22, 2020 in International (PCT) Patent Application No. PCT/JP2020/036481, with English translation.

*Primary Examiner* — Eric A. Ward
(74) *Attorney, Agent, or Firm* — Rimon P.C.

(57) ABSTRACT

A nitride semiconductor device includes: a substrate; a first nitride semiconductor layer; a second nitride semiconductor layer; a first opening penetrating through the second nitride semiconductor layer to the first nitride semiconductor layer; a second opening penetrating through the second nitride semiconductor layer to the first nitride semiconductor layer; an electron transport layer and an electron supply layer provided along an inner face of each of the first opening and the second opening and above the second nitride semiconductor layer; a gate electrode; an anode electrode; a third opening penetrating through the electron supply layer and the electron transport layer to the second nitride semiconductor layer; a source electrode in the third opening; a drain electrode; and a cathode electrode. The anode electrode and the source electrode are electrically connected, and the cathode electrode and the drain electrode are electrically connected.

8 Claims, 8 Drawing Sheets

(51) Int. Cl.
  *H01L 29/20* (2006.01)
  *H01L 29/417* (2006.01)
  *H01L 29/808* (2006.01)
  *H01L 29/812* (2006.01)
  *H01L 29/861* (2006.01)

(52) U.S. Cl.
  CPC .......... *H01L 29/778* (2013.01); *H01L 29/808* (2013.01); *H01L 29/812* (2013.01); *H01L 29/861* (2013.01)

(56) References Cited

U.S. PATENT DOCUMENTS

| | | | |
|---|---|---|---|
| 2017/0005086 A1* | 1/2017 | Twynam | ................ H01L 28/40 |
| 2017/0236908 A1 | 8/2017 | Naito | |
| 2017/0373200 A1 | 12/2017 | Shibata et al. | |

FOREIGN PATENT DOCUMENTS

| | | |
|---|---|---|
| JP | 2017-168579 A | 9/2017 |
| WO | 2015/122135 A1 | 8/2015 |
| WO | 2016/147541 A1 | 9/2016 |

* cited by examiner

NITRIDE SEMICONDUCTOR DEVICE

CROSS-REFERENCE OF RELATED APPLICATIONS

This application is the U.S. National Phase under 35 U.S.C. § 371 of International Patent Application No. PCT/JP2020/036481, filed on Sep. 25, 2020, which in turn claims the benefit of Japanese Patent Application No. 2019-193095, filed on Oct. 24, 2019, the entire disclosures of which applications are incorporated by reference herein.

TECHNICAL FIELD

The present disclosure relates to a nitride semiconductor device.

BACKGROUND ART

Nitride semiconductors, typified by gallium nitride (GaN) and aluminum nitride (AlN), are wide-gap semiconductors which have large band-gaps, and feature greater breakdown fields and higher electron saturated drift velocities than gallium arsenide (GaAs) semiconductors or silicon (Si) semiconductors. As such, power transistors using nitride semiconductors, which are useful in achieving higher outputs and breakdown voltages, are being researched and developed.

For example, Patent Literature (PTL) 1 discloses a semiconductor device including a vertical field-effect transistor (FET) and a Schottky barrier diode (SBD). The SBD serves as a protection element for the FET against surge voltage.

CITATION LIST

Patent Literature

[PTL 1] Japanese Unexamined Patent Application Publication No. 2011-135094

SUMMARY OF INVENTION

Technical Problem

A vertical transistor is applied to, for example, an inverter and performs a switching operation on an inductive load. When turned off, the vertical transistor need consume the energy accumulated by the inductive load. As a result, in some cases, the vertical transistor may break down. In order to reduce the occurrence of the breakdown, diodes are connected in parallel as a protection element that protects the vertical transistor. Since this allows the diodes to consume, as a circulating current, the energy from the inductive load at turn off, it is possible to reduce the occurrence of the breakdown of the vertical transistor.

In the above-described conventional semiconductor device, however, since a breakdown voltage of the SBD used as the protection element is low, a breakdown voltage of the entire semiconductor device is limited by the breakdown voltage of the SBD. In other words, the conventional semiconductor device cannot achieve high breakdown voltage characteristics the vertical FET originally has.

In contrast, a p-n junction diode can be used instead of the SBD to increase a breakdown voltage. However, there is a problem in that a rise voltage of the p-n junction diode is higher than a rise voltage of the SBD. For this reason, if the p-n junction diode is used as a protection element, a conduction loss increases when a circulating current from an inductive load flows through the p-n junction diode.

In view of the above, the present disclosure provides a nitride semiconductor device having a high breakdown voltage and a low loss.

Solution to Problem

A nitride semiconductor device according to one aspect of the present disclosure that includes a vertical transistor and a vertical diode includes: a substrate; a first nitride semiconductor layer of a first conductivity type above the substrate; a second nitride semiconductor layer of a second conductivity type above the first nitride semiconductor layer, the second conductivity type being different from the first conductivity type; a first opening penetrating through the second nitride semiconductor layer to the first nitride semiconductor layer; a second opening provided away from the first opening and penetrating through the second nitride semiconductor layer to the first nitride semiconductor layer; an electron transport layer and an electron supply layer provided, in stated order from a substrate side, along an inner face of each of the first opening and the second opening and above the second nitride semiconductor layer; a gate electrode of the vertical transistor above the electron supply layer and covering the first opening; an anode electrode of the vertical diode above the electron supply layer and covering the second opening; a third opening provided between the first opening and the second opening in a plan view and penetrating through the electron supply layer and the electron transport layer to the second nitride semiconductor layer; a source electrode of the vertical transistor connected to the second nitride semiconductor layer and a portion of each of the electron supply layer and the electron transport layer on a first opening side, in the third opening; a drain electrode of the vertical transistor provided on a side of the substrate facing away from the first nitride semiconductor layer, at a position where the drain electrode overlaps the gate electrode in a plan view; and a cathode electrode of the vertical diode on the side of the substrate facing away from the first nitride semiconductor layer, at a position where the cathode electrode overlaps the anode electrode in a plan view. The anode electrode and the source electrode are electrically connected, and the cathode electrode and the drain electrode are electrically connected.

Advantageous Effects of Invention

The present disclosure provides a nitride semiconductor device having a high breakdown voltage and a low loss.

DESCRIPTION OF EMBODIMENTS

Overview of the Present Disclosure

Figure 1:
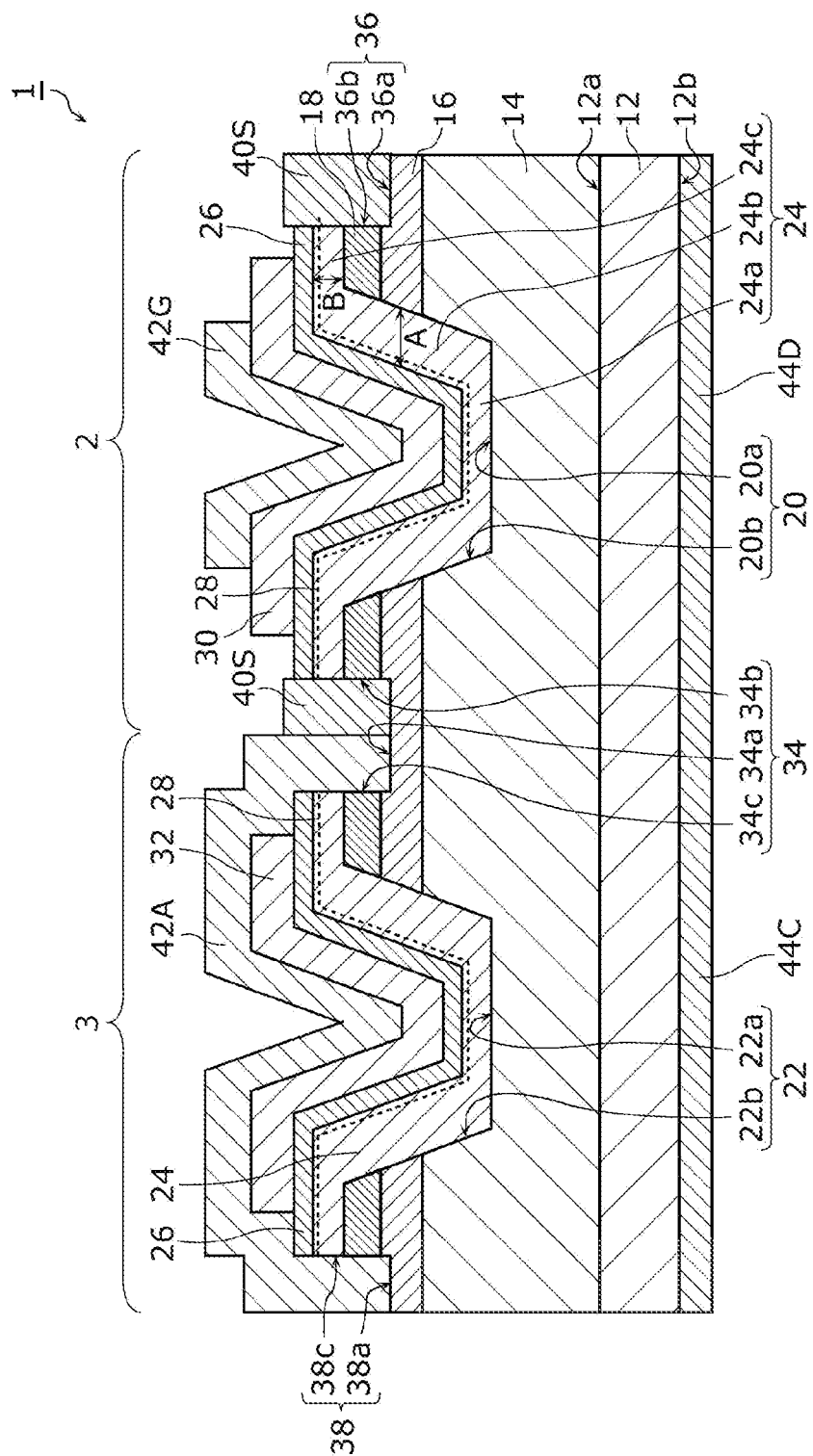
FIG. 1 is a cross-sectional view of a nitride semiconductor device according to Embodiment 1.

In order to solve the above problems, a nitride semiconductor device according to one aspect of the present disclosure that includes a vertical transistor and a vertical diode includes: a substrate; a first nitride semiconductor layer of a first conductivity type above the substrate; a second nitride semiconductor layer of a second conductivity type above the first nitride semiconductor layer, the second conductivity type being different from the first conductivity type; a first opening penetrating through the second nitride semiconductor layer to the first nitride semiconductor layer; a second opening provided away from the first opening and penetrating through the second nitride semiconductor layer to the first nitride semiconductor layer; an electron transport layer and an electron supply layer provided, in stated order from a substrate side, along an inner face of each of the first opening and the second opening and above the second nitride semiconductor layer; a gate electrode of the vertical transistor above the electron supply layer and covering the first opening; an anode electrode of the vertical diode above the electron supply layer and covering the second opening; a third opening provided between the first opening and the second opening in a plan view and penetrating through the electron supply layer and the electron transport layer to the second nitride semiconductor layer; a source electrode of the vertical transistor connected to the second nitride semiconductor layer and a portion of each of the electron supply layer and the electron transport layer on a first opening side, in the third opening; a drain electrode of the vertical transistor provided on a side of the substrate facing away from the first nitride semiconductor layer, at a position where the drain electrode overlaps the gate electrode in a plan view; and a cathode electrode of the vertical diode on the side of the substrate facing away from the first nitride semiconductor layer, at a position where the cathode electrode overlaps the anode electrode in a plan view. The anode electrode and the source electrode are electrically connected, and the cathode electrode and the drain electrode are electrically connected.

With this, since the vertical diode has the same configuration as the vertical transistor whose gate and source are short-circuited, the vertical diode makes it possible to ensure the same breakdown voltage as the vertical transistor. For this reason, it is possible to set the breakdown voltage of the vertical diode to be higher than a breakdown voltage of an SBD. Moreover, it is possible to set a rise voltage of the vertical diode to be lower than or equal to a threshold voltage of the vertical transistor. Accordingly, since it is possible to set the rise voltage of the vertical diode to be lower than a rise voltage of a p-n junction diode, it is possible to reduce a loss of the vertical diode. In this way, it is possible to achieve the nitride semiconductor device having a high breakdown voltage and a low loss.

Moreover, for example, the nitride semiconductor device according to one aspect of the present disclosure may further include: a first threshold adjustment layer between the gate electrode and the electron supply layer; and a second threshold adjustment layer between the anode electrode and the electron supply layer.

With this, the first threshold adjustment layer makes it possible to decrease a carrier concentration immediately below the gate electrode. The decrease in carrier concentration makes it possible to increase a potential of a channel and shift the threshold voltage of the vertical transistor to a positive side. Accordingly, it is possible to cause the vertical transistor to operate as a normally-off field-effect transistor (FET).

Furthermore, for example, the first threshold adjustment layer and the second threshold adjustment layer may each be a nitride semiconductor layer of the second conductivity type.

With this, it is possible to form the first threshold adjustment layer and the second threshold adjustment layer through crystal growth, immediately after the electron transport layer and the electron supply layer are formed through crystal growth. For this reason, since it is possible to reduce an interface defect between the electron supply layer and the first threshold adjustment layer and the second threshold adjustment layer, it is possible to achieve a favorable threshold controllability. In other words, the threshold voltage of the vertical transistor is readily adjusted to a desired value, and it is possible to achieve the nitride semiconductor device having a high reliability.

Moreover, for example, the second threshold adjustment layer may have a thickness less than a thickness of the first threshold adjustment layer.

With this, since it is possible to reduce a shift amount of the rise voltage of the vertical diode toward the positive side, it is possible to further decrease the rise voltage.

Furthermore, for example, the anode electrode may be connected to a portion of each of the electron supply layer and the electron transport layer on a second opening side, in the third opening.

With this, since the anode electrode and the channel in the electron transport layer are Schottky-connected, it is possible to increase the breakdown voltage of the vertical diode.

Moreover, for example, the source electrode may be further connected to a portion of each of the electron supply layer and the electron transport layer on a second opening side, in the third opening.

With this, since the anode electrode and the channel in the electron transport layer are in ohmic contract via the source electrode, it is possible to decrease the rise voltage of the vertical diode.

Furthermore, for example, the nitride semiconductor device may include a plurality of vertical transistors each of which is the vertical transistor, and a plurality of vertical diodes each of which is the vertical diode, and the plurality of vertical transistors and the plurality of vertical diodes may be alternately disposed in a plan view.

With this, since it is possible to achieve the integration of the plurality of vertical transistors and the plurality of vertical diodes, it is possible to reduce the chip area. Additionally, since heat generated by conduction loss readily spreads to the entire chip, it is possible to suppress the concentration of the heat in the nitride semiconductor device.

Moreover, for example, the nitride semiconductor device may include a plurality of vertical transistors each of which is the vertical transistor, and a plurality of vertical diodes each of which is the vertical diode, the plurality of vertical transistors may be disposed adjacent to each other in a first region in a plan view, and the plurality of vertical diodes may be disposed adjacent to each other in a second region in a plan view, the second region being different from the first region.

With this, since it is possible to achieve the integration of the plurality of vertical transistors and the plurality of vertical diodes, it is possible to reduce the chip area.

Embodiments of the present disclosure will be described in detail hereinafter with reference to the drawings.

Note that the following embodiments describe comprehensive or specific examples of the present disclosure. The numerical values, shapes, materials, constituent elements, arrangements and connection states of constituent elements, steps, orders of steps, and the like in the following embodiments are merely examples, and are not intended to limit the present disclosure. Additionally, of the constituent elements in the following embodiments, constituent elements not denoted in the independent claims will be described as optional constituent elements.

Additionally, the drawings are schematic diagrams, and are not necessarily exact illustrations. As such, the scales and so on, for example, are not necessarily consistent from drawing to drawing. Furthermore, configurations that are substantially the same are given the same reference signs in the drawings, and redundant descriptions will be omitted or simplified.

Additionally, in the present specification, terms indicating relationships between elements, such as "parallel" or "perpendicular", terms indicating the shapes of elements, such as "rectangular", and numerical value ranges do not express the items in question in the strictest sense, but rather include substantially equivalent ranges, e.g., differences of several percent, as well.

Additionally, in the present specification, terms such as "above" and "below" do not indicate the upward direction (vertically upward) and the downward direction (vertically downward) in an absolute spatial sense, but rather are used as terms defining relative positional relationships based on layering orders in layered configurations. Moreover, terms such as "above" and "below" are used not only in cases where two constituent elements are disposed with an interval therebetween and another constituent element is present between the stated two constituent elements, but also in cases where two constituent elements are disposed in close contact with each other.

In the present specification, "AlGaN" refers to an $Al_xGa_{1-x}N$ ternary mixed crystal (where $0 \leq x \leq 1$). Hereinafter, for multidimensional mixed crystals, the arrangements of the respective constituent element signs are abbreviated, e.g., AlInN, GaInN and the like. For example, $Al_xGa_{1-x-y}In_yN$ (where $0 \leq x \leq 1$, $0 \leq y \leq 1$, and $0 \leq x+y \leq 1$), which is an example of a nitride semiconductor, is abbreviated as "AlGaInN".

Embodiment 1

First, the configuration of a nitride semiconductor device according to Embodiment 1 will be described with reference to FIG. 1 and FIG. 2.

Figure 2:
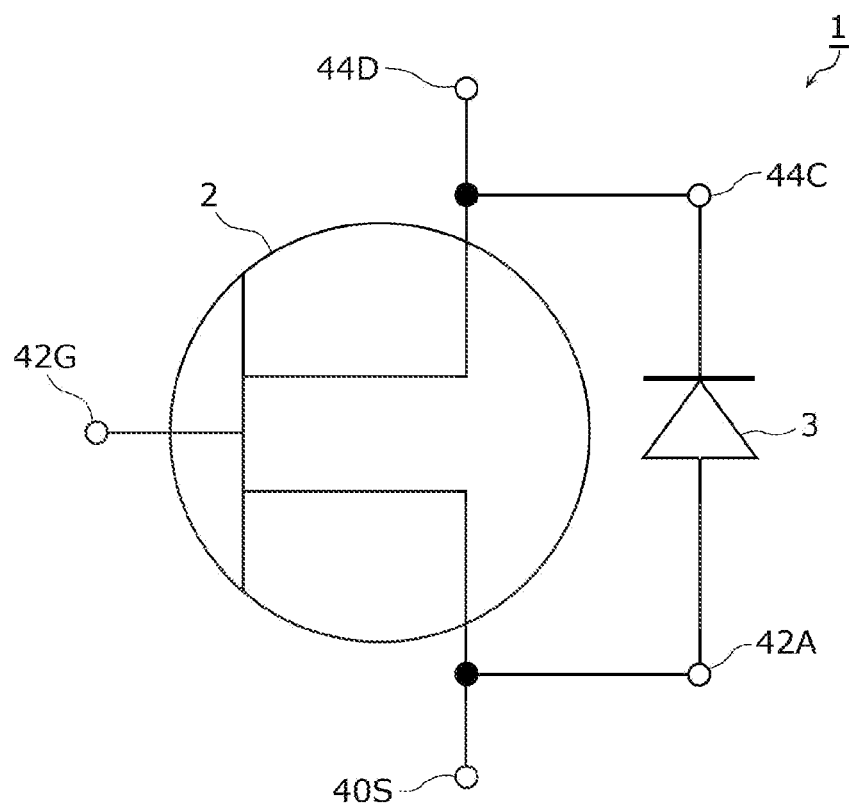
FIG. 2 is a circuit diagram illustrating an equivalent circuit of the nitride semiconductor device according to Embodiment 1.

FIG. 1 is a cross-sectional view of nitride semiconductor device 1 according to the present embodiment. FIG. 2 is a circuit diagram illustrating an equivalent circuit of nitride semiconductor device 1 according to the present embodiment.

Nitride semiconductor device 1 is a device having a layered structure of semiconductor layers that take a nitride semiconductor such as GaN or AlGaN as a primary component. Specifically, nitride semiconductor device 1 has a heterostructure of an AlGaN film and a GaN film.

In the heterostructure of an AlGaN film and a GaN film, highly-concentrated two-dimensional electron gas (2DEG) is produced at the hetero interface due to spontaneous polarization or piezoelectric polarization on a (0001) plane. The device therefore has a characteristic where a sheet carrier concentration of at least $1 \times 10^{13}$ cm$^{-2}$ is achieved at the interface, even in an undoped state.

As shown by FIG. 1, nitride semiconductor device 1 includes substrate 12, drift layer 14, blocking layer 16, high-resistance layer 18, gate opening 20, opening 22, electron transport layer 24, electron supply layer 26, first threshold adjustment layer 30, second threshold adjustment layer 32, source opening 34, opening 36, opening 38, source electrode 40S, anode electrode 42A, gate electrode 42G, drain electrode 44D, and cathode electrode 44C. Moreover, in electron transport layer 24, two-dimensional electron gas 28 is produced along an interface between electron transport layer 24 and electron supply layer 26.

Nitride semiconductor device 1 includes vertical transistor 2 and vertical diode 3. Vertical transistor 2 and vertical diode 3 are arranged side by side in the horizontal direction of substrate 12.

Specifically, vertical transistor 2 includes substrate 12, drift layer 14, blocking layer 16, high-resistance layer 18, gate opening 20, electron transport layer 24, electron supply layer 26, first threshold adjustment layer 30, source opening 34, opening 36, source electrode 40S, gate electrode 42G, and drain electrode 44D. Vertical diode 3 includes substrate 12, drift layer 14, blocking layer 16, high-resistance layer 18, opening 22, electron transport layer 24, electron supply layer 26, second threshold adjustment layer 32, source opening 34, opening 38, and cathode electrode 44C.

As described above, each of substrate 12, drift layer 14, blocking layer 16, high-resistance layer 18, electron transport layer 24, and electron supply layer 26 includes a portion serving as a constituent element of vertical transistor 2, and a portion serving as a constituent element of vertical diode 3. In other words, vertical transistor 2 includes a portion that (i) includes a portion of each of substrate 12, drift layer 14, blocking layer 16, high-resistance layer 18, electron transport layer 24, and electron supply layer 26, and (ii) is a portion located in a directly downward direction of gate electrode 42G (i.e., a portion overlapping gate electrode 42G in a plan view). Vertical diode 3 includes a portion that (i) includes a portion of each of substrate 12, drift layer 14, blocking layer 16, high-resistance layer 18, electron transport layer 24, and electron supply layer 26, and (ii) is a portion located in a directly downward direction of anode electrode 42A (i.e., a portion overlapping anode electrode 42A in a plan view). In the present embodiment, for descriptive purposes, the constituent elements of nitride semiconductor device 1 can be divided into a portion belonging to vertical transistor 2 and a portion belonging to vertical diode 3 along the boundary between source electrode 40S and anode electrode 42A in a plan view.

Vertical transistor 2 is a field-effect transistor (FET) that uses two-dimensional electron gas 25 produced at the AlGaN/GaN hetero interface as a channel. Vertical transistor 2 according to the present embodiment is a normally-off FET. In nitride semiconductor device 2, source electrode 40S is grounded (i.e., is at a potential of 0 V), and a positive potential is applied to drain electrode 44D, for example. The potential applied to drain electrode 44D is at least 100 V and no more than 1200 V, for example, but is not limited thereto. When vertical transistor 2 is in the OFF-state, a negative potential (e.g., −5 V) is applied to gate electrode 42G. When vertical transistor 2 is in the ON-state, a positive potential (e.g., +5 V) is applied to gate electrode 42G.

It should be noted that when vertical transistor 2 is used as a switching element of an inverter, a resistance element or an inductor element (an external inductive load) is connected in series to drain electrode 44D or source electrode 40S. For this reason, since a source-drain resistance of vertical transistor 2 decreases when vertical transistor 2 enters the ON-state, most of the voltage applied between the source and the drain is applied to the resistance element or the inductor element. As such, the potential actually applied to drain electrode 44D decreases to approximately 0.5 V.

Vertical diode 3 is connected in parallel between the source and the drain of vertical transistor 2. Specifically, as shown by FIG. 2, anode electrode 42A of vertical diode 3 and source electrode 40S of vertical transistor 2 are electrically connected. Cathode electrode 44C of vertical diode 3 and drain electrode 44D of vertical transistor 2 are electrically connected.

Accordingly, when vertical transistor 2 is in the ON-state, a current flows from drain electrode 44D to source electrode 40S via vertical transistor 2 and is supplied to the inductive load. When vertical transistor 2 is in the OFF-state, a circulating current flows from source electrode 40S (anode electrode 42A) to drain electrode 44D (cathode electrode 44C) via vertical diode 3. Since vertical diode 3 makes it possible to consume, as a circulating current, the energy from the inductive load at turn off as described above, it is possible to reduce the occurrence of the breakdown of vertical transistor 2.

The various constituent elements included in nitride semiconductor device 1 will be described hereinafter.

Substrate 12 is a substrate including a nitride semiconductor, and has main surface 12a and main surface 12b opposite to main surface 12a as shown by FIG. 1. Main surface 12a is a main surface on a side where drift layer 14 is formed. Specifically, main surface 12a substantially coincides with the c plane. Main surface 12b is a main surface on a side where drain electrode 44D and cathode electrode 44C are formed. Seen in plan view, the shape of substrate 12 is a rectangle, for example, but the shape is not limited thereto.

Substrate 12 is, for example, a substrate formed from $n^+$-type GaN with a thickness of 300 μm and a carrier concentration of $1 \times 10^{18}$ cm$^{-3}$. Note that "n-type" and "p-type" indicate conductivity types of semiconductors. "$n^+$-type" indicates a state where an n-type dopant has been excessively added to a semiconductor, i.e., a so-called "heavily-doped" state. "$n^-$-type" indicates a state where an n-type dopant has been insufficiently added to a semiconductor, i.e., a so-called "lightly-doped" state. The same applies to "$p^+$-type" and "$p^-$-type". n-type, $n^+$-type, and $n^-$-type are examples of a first conductivity type. p-type, $p^+$-type, and $p^-$-type are examples of a second conductivity type different from the first conductivity type.

Note that substrate 12 need not be a nitride semiconductor substrate. For example, substrate 12 may be a silicon (Si) substrate, a silicon carbide (SiC) substrate, a zinc oxide (ZnO) substrate, or the like.

Drift layer 14 is an example of a first nitride semiconductor layer of the first conductivity type provided above substrate 12. Drift layer 14 is, for example, a film formed from $n^-$-type GaN with a thickness of 8 μm. A donor concentration of drift layer 14 is, for example, in a range of at least $1 \times 10^{15}$ cm$^{-3}$ and no more than $1 \times 10^{17}$ cm$^{-3}$, e.g., $1 \times 10^{16}$ cm$^{-3}$. Additionally, a carbon concentration (C concentration) of drift layer 14 is in a range of at least $1 \times 10^{15}$ cm$^{-3}$ and no more than $2 \times 10^{17}$ cm$^{-3}$.

Drift layer 14 is provided so as to be in contact with main surface 12a of substrate 12, for example. Drift layer 14 is formed on main surface 12a of substrate 12 through crystal growth achieved by metalorganic vapor-phase epitaxy (MOVPE), for example.

Blocking layer 16 is an example of a second nitride semiconductor layer of the second conductivity type provided above drift layer 14. Blocking layer 16 is, for example, a film formed from p-type GaN with a thickness of 400 nm and a carrier concentration of $1 \times 10^{17}$ cm$^{-3}$. Blocking layer 16 is provided so as to be in contact with a top face of drift layer 14. Blocking layer 16 is formed on drift layer 14 through crystal growth achieved by MOVPE or the like, for example. Note that blocking layer 16 may be formed by implanting magnesium (Mg) into an i-type GaN film which has been formed through deposition.

Blocking layer 16 suppresses leakage current between source electrode 40S and drain electrode 44D. For example, when a reverse voltage is applied to a p-n junction formed by blocking layer 16 and drift layer 14, and more specifically, when drain electrode 44D is at a higher potential than source electrode 40S, a depletion layer extends along drift layer 14. This makes it possible to increase the breakdown voltage of vertical transistor 2. As described above, in the present embodiment, drain electrode 40D is at a higher potential than source electrode 40S in both the OFF-state and the ON-state. For this reason, it is possible to increase the breakdown voltage of vertical transistor 2. Since vertical diode 3 has the same configuration, it is possible to increase the breakdown voltage of vertical diode 3.

In the present embodiment, as shown by FIG. 1, blocking layer 16 makes contact with source electrode 40S and anode electrode 42A. Accordingly, blocking layer 16 is fixed to the same potential as source electrode 40S and anode electrode 42A.

High-resistance layer 18 is an example of a high-resistance layer provided above blocking layer 16. High-resistance layer 18 has a higher resistance than blocking layer 16. High-resistance layer 18 is formed from an insulative or semi-insulative nitride semiconductor. High-resistance layer 18 is, for example, a film formed from undoped GaN having a thickness of 200 nm. High-resistance layer 18 is provided so as to be in contact with blocking layer 16. High-resistance layer 18 is formed on blocking layer 16 through crystal growth achieved by MOVPE or the like, for example.

Note that "undoped" means that the material is not doped with a dopant such as Si or Mg, which changes the polarity of GaN to n-type or p-type. In the present embodiment, high-resistance layer 18 is doped with carbon (C). Specifically, a C concentration of high-resistance layer 18 is higher than a C concentration of blocking layer 16.

Additionally, high-resistance layer 18 may contain silicon (Si) or oxygen (O) which intermix during film formation. In this case, the C concentration of high-resistance layer 18 is higher than the silicon concentration (Si concentration) or the oxygen concentration (O concentration). For example, the C concentration of high-resistance layer 18 is at least $3 \times 10^{17}$ cm$^{-3}$, but may be at least $1 \times 10^{18}$ cm$^{-3}$. The Si concentration or O concentration of high-resistance layer 18 is, for example, no more than $5 \times 10^{16}$ cm$^{-3}$, but may be no more than $2 \times 10^{16}$ cm$^{-3}$.

Note that aside from carbon, high-resistance layer 18 may be formed by ion implantation using magnesium (Mg), iron (Fe), boron (B), or the like. Other ion types may be used as long as they are ion types with which the resistance of the GaN can be increased.

Here, if, for example, nitride semiconductor device 1 does not include high-resistance layer 18, a parasitic npn structure constituted by electron transport layer 24, p-type blocking layer 16, and n-type drift layer 14, i.e., a parasitic bipolar transistor, will be present between source electrode 40S and drain electrode 44D. As such, if, when vertical transistor 2 is off, a current flows through p-type blocking layer 16, the parasitic bipolar transistor will turn on, and there is thus a risk that the breakdown voltage of vertical transistor 2 may drop. In this case, vertical transistor 2 is more likely to malfunction. In the present embodiment, providing high-resistance layer 18 makes it possible to suppress situations in which a parasitic npn structure is formed, and suppress malfunctions in vertical transistor 2. Since vertical diode 3 has the same configuration, it is possible to suppress malfunctions in vertical diode 3.

A layer for suppressing a situation in which p-type impurities, such as Mg, disperse from blocking layer 16 may be provided on a top face of high-resistance layer 18. For example, a 20 nm-thick AlGaN layer may be provided on high-resistance layer 18.

Gate opening 20 is an example of a first opening which penetrates through blocking layer 16 to drift layer 14. Gate opening 20 penetrates through both high-resistance layer 18 and blocking layer 16. Bottom face 20a of gate opening 20 corresponds to the top face of drift layer 14. As illustrated in FIG. 1, bottom face 20a is located lower than an interface between blocking layer 16 and drift layer 14. Bottom face 20a is parallel to main surface 12a of substrate 12.

In the present embodiment, gate opening 20 is formed so that the area of the opening increases with distance from substrate 12. Specifically, side face 20b of gate opening 20 is inclined at an angle. As illustrated in FIG. 1, the cross-sectional shape of gate opening 20 is an inverted trapezoid, and more specifically, an inverted isosceles trapezoid.

An inclination angle of side face 20b relative to bottom face 20a is in a range of at least 30° and no more than 45°, for example. Having the inclination angle at no more than 45° brings side face 20b closer to the c plane, which makes it possible to improve the film properties of electron transport layer 24 and the like formed along side face 20b through crystal regrowth. Having the inclination angle at at least 30° suppresses a situation in which gate opening 20 becomes too large, which makes nitride semiconductor device 1 smaller.

Figure 3:
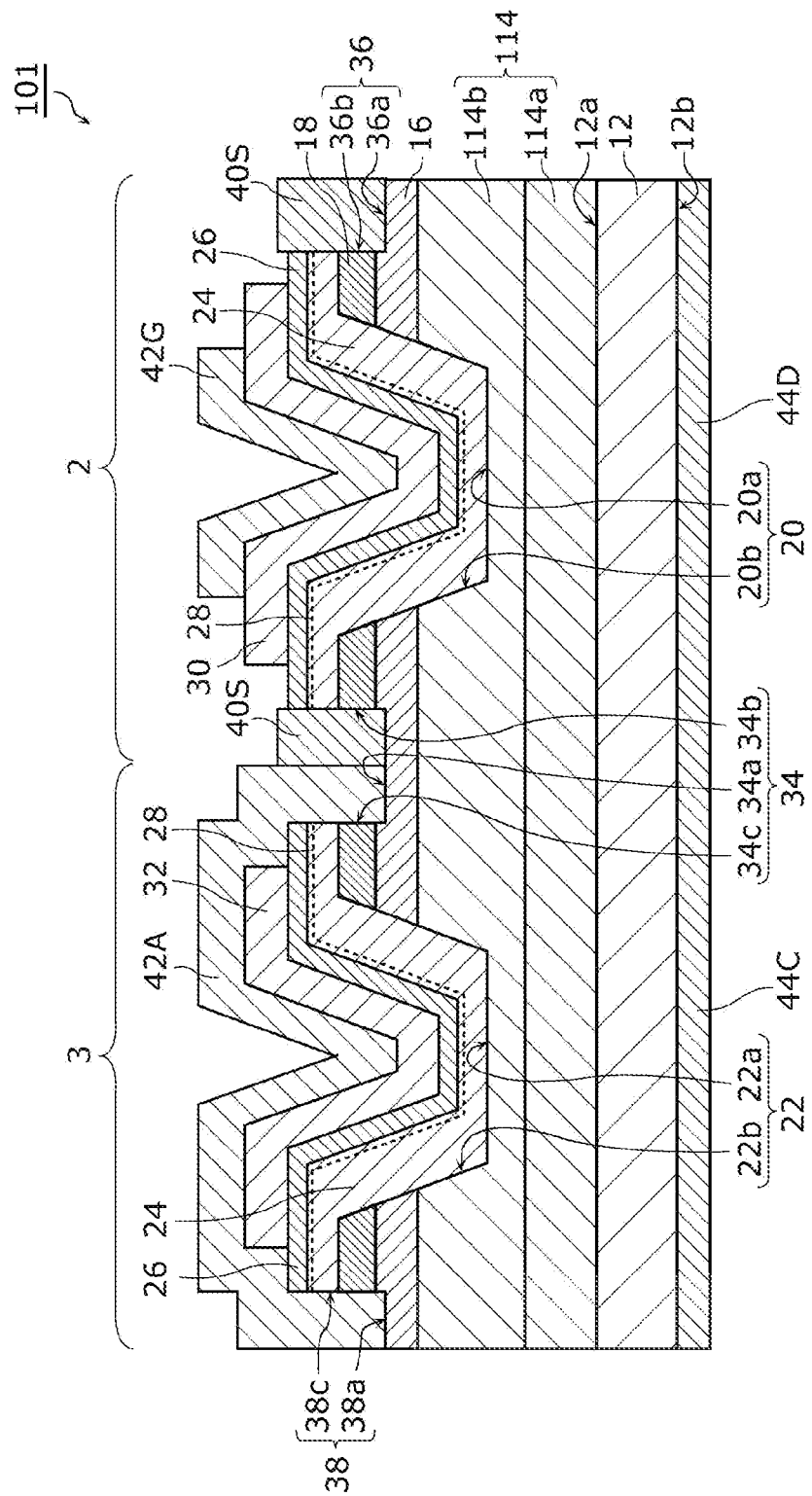
FIG. 3 is a cross-sectional view of a nitride semiconductor device according to Variation 1 of Embodiment 1.

Opening 22 is an example of a second opening which is provided away from gate opening 20 and penetrates through blocking layer 16 to drift layer 14. Opening 22 has the same configuration as gate opening 20. Specifically, as shown by FIG. 3, opening 22 has bottom face 22a and side face 22b. Opening 22 and gate opening 20 are formed at the same time, for example.

Gate opening 20 and opening 22 are formed by first forming drift layer 14, blocking layer 16, and high-resistance layer 18 in stated order on main surface 12a of substrate 12, and then removing part of each of high-resistance layer 18 and blocking layer 16 such that drift layer 14 is partially exposed. At this time, bottom face 20a of gate opening 20 and bottom face 22a of opening 22 are formed lower than the interface between blocking layer 16 and drift layer 14 by removing a part, having a predetermined thickness, of a surface layer of drift layer 14.

The removal of high-resistance layer 18 and blocking layer 16 is performed by applying and patterning a resist, and performing dry etching. Specifically, the resist is baked after being patterned so that end parts of the resist are inclined. Thereafter, by performing dry etching, the shape of the resist is transferred, which forms gate opening 20 of which side face 20b is inclined and opening 22 of which side face 22b is inclined.

Electron transport layer 24 is an example of a first regrowth layer provided along an inner face of each of gate opening 20 and opening 22 and above blocking layer 16. Specifically, electron transport layer 24 is provided along bottom face 20a and side face 20b of gate opening 20 and bottom face 22a and side face 22b of opening 22. Furthermore, electron transport layer 24 is provided on the top face of high-resistance layer 18. Electron transport layer 24 is, for example, a film formed from undoped GaN having a thickness of 150 nm. Although undoped here, electron transport layer 24 may be given n-type conductivity by being doped with Si or the like.

Electron transport layer 24 makes contact with drift layer 14 at bottom face 20a and side face 20b of gate opening 20. Electron transport layer 24 makes contact with blocking layer 16 and high-resistance layer 18 at side face 20b of gate opening 20. Electron transport layer 24 makes contact with drift layer 14 at bottom face 22a and side face 22b of opening 22. Electron transport layer 24 makes contact with an end face of each blocking layer 16 and high-resistance layer 18 at side face 22b of opening 22. Furthermore, electron transport layer 24 makes contact with the top face of high-resistance layer 18. Electron transport layer 24 is formed through crystal regrowth after gate opening 20 and opening 22 have been formed.

Electron transport layer 24 has a channel. Specifically, two-dimensional electron gas 28 is produced near the interface between electron transport layer 24 and electron supply layer 26. Two-dimensional electron gas 28 functions as the channel of electron transport layer 24. In FIG. 1, two-dimensional electron gas 28 is schematically indicated by a broken line. Two-dimensional electron gas 28 curves along the interface between electron transport layer 24 and electron supply layer 26, i.e., along the inner face of gate opening 20 and the inner face of opening 22.

Additionally, although not illustrated in FIG. 1, an approximately 1 nm-thick AlN film may be provided, as a second regrowth layer, between electron transport layer 24 and electron supply layer 26. The AlN film suppresses alloy scattering, which makes it possible to improve channel mobility.

Electron supply layer 26 is an example of a third regrowth layer provided along the inner face of each of gate opening 20 and opening 22 and above blocking layer 16. Electron transport layer 24 and electron supply layer 26 are provided in stated order from a substrate 12 side. Electron supply layer 26 is formed on a top face of electron transport layer 24 at a substantially uniform thickness. Electron supply layer 26 is, for example, a film formed from undoped AlGaN having a thickness of 50 nm. Electron supply layer 26 is formed through crystal regrowth after the process of forming electron transport layer 24.

Electron supply layer 26 forms an AlGaN/GaN hetero interface with electron transport layer 24. Two-dimensional electron gas 28 is produced within electron transport layer 24 as a result. Electron supply layer 26 supplies electrons to the channel formed in electron transport layer 24 (i.e., to two-dimensional electron gas 28).

First threshold adjustment layer 30 is provided between gate electrode 42G and electron supply layer 26. First threshold adjustment layer 30 is provided on electron supply layer 26 and in contact with electron supply layer 26 and gate electrode 42G.

Second threshold adjustment layer 32 is provided between anode electrode 42A and electron supply layer 26. Second threshold adjustment layer 32 is provided on electron supply layer 26 and in contact with electron supply layer 26 and anode electrode 42A.

In the present embodiment, second threshold adjustment layer 32 has the same configuration as first threshold adjustment layer 30. Specifically, second threshold adjustment layer 32 has the same thickness as first threshold adjustment layer 30. First threshold adjustment layer 30 and second threshold adjustment layer 32 are, for example, each a nitride semiconductor layer formed from p-type AlGaN with a thickness of 100 nm and a carrier concentration of $1 \times 10^{17}$ $cm^{-3}$. First threshold adjustment layer 30 and second threshold adjustment layer 32 are formed through MOVPE and patterning, after the process of forming electron supply layer 26.

Providing first threshold adjustment layer 30 increases the potential at the end of the conducting band of the channel part. Accordingly, it is possible to increase a threshold voltage of vertical transistor 2. As a result, it is possible to achieve vertical transistor 2 as a normally-off FET. In other words, vertical transistor 2 can be turned off when a potential of 0 V is applied to gate electrode 42G. Likewise, providing second threshold adjustment layer 32 can make a rise voltage of vertical diode 3 equal to a rise voltage of vertical transistor 2.

It should be noted that first threshold adjustment layer 30 and second threshold adjustment layer 32 need not each be a p-type nitride semiconductor layer. For example, first threshold adjustment layer 30 and second threshold adjustment layer 32 may each be an insulating film such as a silicon nitride film, a silicon oxide film, or the like. First threshold adjustment layer 30 and second threshold adjustment layer 32 may each be formed using any material as long as it is a material capable of increasing the channel potential. First threshold adjustment layer 30 and second threshold adjustment layer 32 may each be formed using a different material.

Source opening 34 is an example of a third opening which is provided between gate opening 20 and opening 22 in a plan view and penetrates through electron transport layer 24 and electron supply layer 26 to blocking layer 16. Source opening 34 also penetrates through high-resistance layer 18. In a plan view, source opening 34 is provided in a location distanced from gate electrode 42G. In the present embodiment, at least part of source electrode 40S and at least part of anode electrode 42A are formed in source opening 34.

Bottom face 34a of source opening 34 corresponds to a top face of blocking layer 16. As illustrated in FIG. 1, bottom face 34a is located lower than an interface between high-resistance layer 18 and blocking layer 16. Bottom face 34a is parallel to main surface 12a of substrate 12.

As illustrated in FIG. 1, source opening 34 is formed so that the area of the opening is constant regardless of distance from substrate 12. Specifically, side faces 34b and 34c of source opening 34 are perpendicular to bottom face 34a. In other words, the cross-sectional shape of source opening 34 is a rectangle.

Side face 34b is a side face on a gate opening 20 side. Two-dimensional electron gas 28 functioning as the channel of vertical transistor 2 is exposed to side face 34b. Two-dimensional electron gas 28 exposed to side face 34b is connected to source electrode 40S.

Side face 34c is a side face on an opening 22 side. Two-dimensional electron gas 28 functioning as a current path of vertical diode 3 is exposed to side face 34c. Two-dimensional electron gas 28 exposed to side face 34c is connected to anode electrode 40A.

It should be noted that, like gate opening 20 and opening 22, source opening 34 may be formed so that the area of the opening increases with distance from substrate 12. Specifically, side faces 34b and 34c of source opening 34 may be inclined at an angle. For example, the cross-sectional shape of source opening 34 may be an inverted trapezoid, and more specifically, an inverted isosceles trapezoid. Here, an inclination angle of each of side faces 34b and 34c relative to bottom face 34a may be in a range of at least 30° and no more than 60°, for example. The inclination angle of side face 34b and the inclination angle of side face 34c may be the same as or different from each other. For example, the inclination angle of side face 34b of source opening 34 may be greater than the inclination angle of side face 20b of gate opening 20. Having side face 34b inclined at an angle increases the contact area between source electrode 40S and electron transport layer 24 (two-dimensional electron gas 28), which makes it easy to achieve ohmic contact.

In the present embodiment, opening 36 is further provided so that gate opening 20, first threshold adjustment layer 30, and gate electrode 42G are located between opening 36 and source opening 34 in a plan view. Like source opening 34, opening 36 penetrates through electron supply layer 26, electron transport layer 24, and high-resistance layer 18 to blocking layer 16. Source electrode 40S is formed in opening 36 and electrically connected to two-dimensional electron gas 28 exposed to side face 36b of opening 36. Side face 36b is a side face on the gate opening 20 side.

Additionally, opening 38 is further provided so that opening 22 and second threshold adjustment layer 32 are located between opening 38 and source opening 34 in a plan view. Like source opening 34, opening 38 penetrates through electron supply layer 26, electron transport layer 24, and high-resistance layer 18 to blocking layer 16. Anode electrode 42A is formed in opening 38 and electrically connected to two-dimensional electron gas 28 exposed to side face 38c of opening 38. Side face 38c is a side face on the opening 22 side.

Source opening 34 and openings 36 and 38 are formed by etching electron supply layer 26, electron transport layer 24, and high-resistance layer 18 to expose blocking layer 16 in a region different from gate opening 20 and opening 20, after the crystal regrowth process (specifically, the process of forming first threshold adjustment layer 30 and second threshold adjustment layer 32), for example. By also removing a surface part of blocking layer 16 at this time, bottom face 34a of source opening 34, bottom face 36a of opening 36, and bottom face 38a of opening 38 are formed lower than the interface between high-resistance layer 18 and blocking layer 16. The same holds true for openings 36 and 38. Source opening 34 and openings 36 and 38 are each formed in a predetermined shape through, for example, patterning through photolithography, dry etching, and the like.

Source electrode 40S is provided in each of source opening 34 and opening 36. For example, source electrodes 40S are provided so that gate electrode 42G, first threshold adjustment layer 30, and gate opening 20 are located between source electrodes 40S.

In the present embodiment, in each of source opening 34 and opening 36, source electrode 40S is connected to blocking layer 16 and a portion of each of electron supply layer 26 and electron transport layer 24 on the gate opening 20 side. Specifically, source electrode 40S is provided so as to fill source opening 34 and opening 36, in a position distanced from gate electrode 42G. Source electrode 40S makes ohmic contact with electron transport layer 24 and electron supply layer 26. Specifically, source electrode 40S is in direct contact with two-dimensional electron gas 28 at each of side face 34b of source opening 34 and side face 36b of opening 36. Contact resistance between source electrode 40S and two-dimensional electron gas 28 (the channel) can be reduced as a result.

Source electrode 40S is formed using a conductive material such as a metal. For example, a material which makes ohmic contact with an n-type semiconductor layer, such as Ti/Al, can be used as the material of source electrode 40S. Source electrode 40S is formed by patterning a conductive film formed through sputtering or vapor deposition, for example.

Gate electrode 42G is provided above electron supply layer 26 so as to cover gate opening 20. In the present embodiment, gate electrode 42G is provided in contact with a top face of first threshold adjustment layer 30. Gate electrode 42 is located in gate opening 20 in a plan view, for example. In other words, in the example shown by FIG. 1, gate electrode 42G covers not the entirety but only part of gate opening 20.

It should be noted that gate electrode 42 may cover the entirety of gate opening 20 in a plan view. Specifically, in the cross-sectional view shown by FIG. 1, an end part of gate electrode 42G closest to source electrode 40S may be located closer to source electrode 40S than an opening end of gate opening 20 (i.e., an upper end of side face 20b) is.

Gate electrode 42G is formed using a conductive material such as a metal. Gate electrode 42G is formed using palladium (Pd), for example. Note that a material which is Schottky-connected to an n-type semiconductor can be used as the material of gate electrode 42G, and thus a nickel (Ni)-based material, tungsten silicide (WSi), gold (Au), or the like can be used, for example. Gate electrode 42G is formed by patterning a conductive film formed through sputtering or vapor deposition, for example, after first threshold adjustment layer 30 has been formed, after source opening 34 has been formed, or after source electrode 40S has been formed.

Anode electrode 42A is provided above electron supply layer 26 so as to cover opening 22. In the present embodiment, anode electrode 42A is provided in contact with a top face of second threshold adjustment layer 30. In a plan view, anode electrode 42A covers the entirety of opening 22 In the present embodiment, part of anode electrode 42A is provided in source opening 34 and opening 38. Anode electrode 42A is in contact with source electrode 40S in source opening 34.

Moreover, in each of source opening 34 and opening 38, anode electrode 42A is connected to blocking layer 16 and a portion of each of electron supply layer 26 and electron transport layer 24 on the opening 22 side. Anode electrode 42A is in direct contact with two-dimensional electron gas 28 at each of side face 34c of source opening 34 and side face 38c of opening 38.

Anode electrode 42A is formed using the same material as gate electrode 42G. Anode electrode 42A is formed using Pd, for example. For this reason, anode electrode 42A is Schottky-connected to electron supply layer 26 and electron transport layer 24.

Drain electrode 44D and cathode electrode 44C are provided on a side of substrate 12 facing away from drift layer 14. Specifically, drain electrode 44D and cathode electrode 44C are provided so as to be in contact with main surface 12b of substrate 12. Drain electrode 44D and cathode electrode 44C are each formed using a conductive material such as a metal. For example, like the material of source electrode 40S, a material which makes ohmic contact with an n-type semiconductor, such as Ti/Al, can be used as the material of each of drain electrode 44D and cathode electrode 44C. Drain electrode 44D and cathode electrode 44C are each formed by patterning a conductive film formed through sputtering or vapor deposition, for example.

In the present embodiment, drain electrode 44D and cathode electrode 44C are each a plate electrode provided on main surface 12b of substrate 12. For this reason, drain electrode 44D and cathode electrode 44C are electrically connected. Of the plate electrode provided on main surface 12b of substrate 12, a portion located in a position where the portion overlaps gate electrode 42G in a plan view is drain electrode 44D. Of the plate electrode, a portion located in a position where the portion overlaps anode electrode 42A in a plan view is cathode electrode 44C.

A characteristic configuration of nitride semiconductor device 1 according to the present embodiment will be described next.

[Configuration of Vertical Diode]

As described above, vertical diode 3 has a configuration equivalent to a configuration in which the gate and source of vertical transistor 2 are short-circuited. This allows the reverse characteristics of vertical diode 3 to obtain a breakdown voltage equivalent to a breakdown voltage of the OFF characteristics of vertical transistor 2.

Moreover, since vertical diode 3 has the configuration equivalent to the configuration of vertical transistor 2, vertical diode 3 can obtain more favorable forward characteristics than a p-n junction diode. Generally, a rise voltage of the p-n junction diode is approximately 3.4 V. In the present embodiment, a rise voltage of vertical diode 3 is substantially equal to a threshold voltage of vertical transistor 2, and can be easily designed to be lower than or equal to 3.4 V. The threshold voltage and the rise voltage can be adjusted, for example, using the thickness of first threshold adjustment layer 30 and second threshold adjustment layer 32.

Accordingly, it is possible to achieve nitride semiconductor device 1 capable of operating at a higher breakdown voltage than ever before and performing energy consumption using a surge voltage and a circulating current with low loss.

It should be noted that in the present embodiment, vertical diode 3 differs from vertical transistor 2 in the material connected to two-dimensional electron gas 28 that is the channel. Specifically, the material in Schottky contact with the n-type semiconductor is, as part of anode electrode 42A, in contact with two-dimensional electron gas 28 in vertical diode 3, whereas the material in ohmic contact with the n-type semiconductor is, as source electrode 40S, in contact with two-dimensional electron gas 28 in vertical transistor 2. For this reason, the rise voltage of vertical diode 3 becomes higher than the threshold voltage of vertical transistor 2 by a voltage (offset voltage) equivalent to a forward voltage due to the Schottky contact. Accordingly, even when vertical transistor 2 is of a normally-off type, and the threshold voltage is lower than 0 V, it is possible to set the rise voltage of vertical diode 3 to be higher than 0 V.

[Thickness of Electron Transport Layer]

As illustrated in FIG. 1, electron transport layer 24 includes bottom face part 24a provided on bottom face 20a, inclined part 24b provided along side face 20b, and flat part 24c provided on the top face of high-resistance layer 18. In the present embodiment, length A of inclined part 24b along a direction parallel to substrate 12 is greater than length B of flat part 24c along a thickness direction of substrate 12.

Generally, in a vertical FET formed using a nitride semiconductor material, the GaN crystal growth is performed such that the c plane of the GaN crystals is parallel to main surface 12a of substrate 12. At this time, the polarization of two-dimensional electron gas 28 is lower at parts inclined relative to the c plane than at parts parallel to the c plane, resulting in reduced carrier concentration. In other words, two-dimensional electron gas 28 has a lower carrier concentration at parts within inclined part 24b than at parts within flat part 24c. Accordingly, the part of two-dimensional electron gas 28 within inclined part 24b is susceptible to the narrowing effect produced by the barrier layer extending from blocking layer 16.

As illustrated in FIG. 1, in the present embodiment, length A of inclined part 24b is greater than length B of flat part 24c. As such, two-dimensional electron gas 28 is farther from blocking layer 16 at the parts within inclined part 24b than at the parts within flat part 24c. Accordingly, the channel narrowing effect of the barrier layer can be suppressed, and thus a drop in the on-resistance can be suppressed.

On the other hand, when the length of electron transport layer 24 in the thickness direction (i.e., the thickness of electron transport layer 24) is short, the depth of source opening 34 and openings 36 and 38 also becomes shallow. Thus, by making source opening 34 and openings 36 and 38 shallower, the process time required to remove film through etching can be shortened. Additionally, making source opening 34 and openings 36 and 38 shallow improves the coverage of metal electrodes formed in subsequent processes as well, which reduces the on-resistance.

In this manner, making length A of inclined part 24b less than length B of flat part 24c not only enables high-current operations, but also makes it possible to simplify processes and reduce the on-resistance.

[End Parts of Gate Electrode]

In the present embodiment, a threshold voltage can be adjusted by having gate electrode 42G completely or only partially cover gate opening 20. In other words, the threshold voltage can be adjusted in accordance with the position of the end parts of gate electrode 42G.

In a plan view, gate electrode 42G at least partially covers bottom face 20a and side face 20b of gate opening 20, for example. Specifically, in a plan view, gate electrode 42G is provided on an inner side of gate opening 20. For example, when viewed in the cross-section illustrated in FIG. 1, an end part of gate electrode 42G may be positioned farther from source electrode 40S than the upper end of side face 20b of gate opening 20, in the direction parallel to substrate 12. Specifically, the end part of gate electrode 42G may be positioned overlapping with side face 20b in the direction directly vertical therefrom, i.e., in a plan view.

In this case, the threshold voltage of vertical transistor 2 is determined only by the configuration at the part following side face 20b of gate opening 20. This makes it possible to increase the carrier concentration of flat part 24c, and the on-resistance can therefore be reduced.

Alternatively, in a plan view, gate electrode 42G may completely cover bottom face 20a and side face 20b. In other words, in a plan view, gate opening 20 may be provided on the inner side of gate electrode 42G. When viewed in the cross-section illustrated in FIG. 1, an end part of gate electrode 42G is positioned closer to source electrode 40S than the upper end of side face 20b of gate opening 20, in the direction parallel to substrate 12 (i.e., a left-right direction in the drawing).

In this case, the threshold voltage of vertical transistor 2 is determined by which of a part of gate opening 20 following side face 20b (specifically, the inclined part of two-dimensional electron gas 28) and a flat part on an outer side of gate opening 20 (specifically, the flat part of two-dimensional electron gas 28) has the higher threshold voltage. For example, when the threshold voltage is determined by the flat part of two-dimensional electron gas 28, the distance from blocking layer 16 to two-dimensional electron gas 28 is made longer at the flat part than at the inclined part. Specifically, length A of inclined part 24b of electron transport layer 24 is made greater than length B of flat part 24c. This makes it possible to suppress the influence of depletion from blocking layer 16, and makes it possible to set the threshold voltage at inclined part 24b lower than the threshold voltage at flat part 24c.

[Variations]

Variations of Embodiment 1 will be described next. The following descriptions will focus on the differences from Embodiment 1, and descriptions of common points will be omitted or simplified.

[Variation 1]

FIG. 3 is a cross-sectional view of nitride semiconductor device 101 according to the present variation. As illustrated in FIG. 3, nitride semiconductor device 101 differs from nitride semiconductor device 1 according to Embodiment 1 in including drift layer 114 instead of drift layer 14.

In drift layer 114, the donor concentration has two different levels in the vertical direction of drift layer 114. Specifically, as illustrated in FIG. 3, drift layer 114 has high-concentration layer 114a and low-concentration layer 114b.

High-concentration layer 114a is provided so as to be in contact with main surface 12a of substrate 12.

Low-concentration layer 114b is provided between high-concentration layer 114a and blocking layer 16, and is in contact with both. Low-concentration layer 114b has a lower donor concentration than high-concentration layer 114a.

In this manner, by making the donor concentration in low-concentration layer 114b on a blocking layer 16 side (an upper side) lower than the donor concentration in high-concentration layer 114a on the side closer to substrate 12 (a lower side), a barrier layer is prompted to extend into drift layer 114 when a high voltage is applied to drain electrode 44D in the OFF-state. This makes it possible to increase a breakdown voltage when vertical transistor 2 is in the OFF-state. The same holds true for vertical diode 3.

Although the present embodiment describes an example in which drift layer 114 has two layers, drift layer 114 may be divided into three or four layers, or into five or more layers. Alternatively, drift layer 114 may have a multilayer structure in which the donor concentration gradually increases from the substrate 12 side toward the blocking layer 16 side, with the respective layers being sufficiently thin. In other words, a graded structure in which the donor concentration is gradually reduced from the substrate 12 side toward the blocking layer 16 side within drift layer 114 may be used. The same effects as those of the present embodiment can be achieved in such a case as well.

The donor concentration may be controlled by controlling the concentration of Si serving as the donor, or by controlling the concentration of C serving as the acceptor which compensates for Si. In sum, what is important is that there are multiple net donor concentrations within drift layer 114.

[Variation 2]

Figure 4:
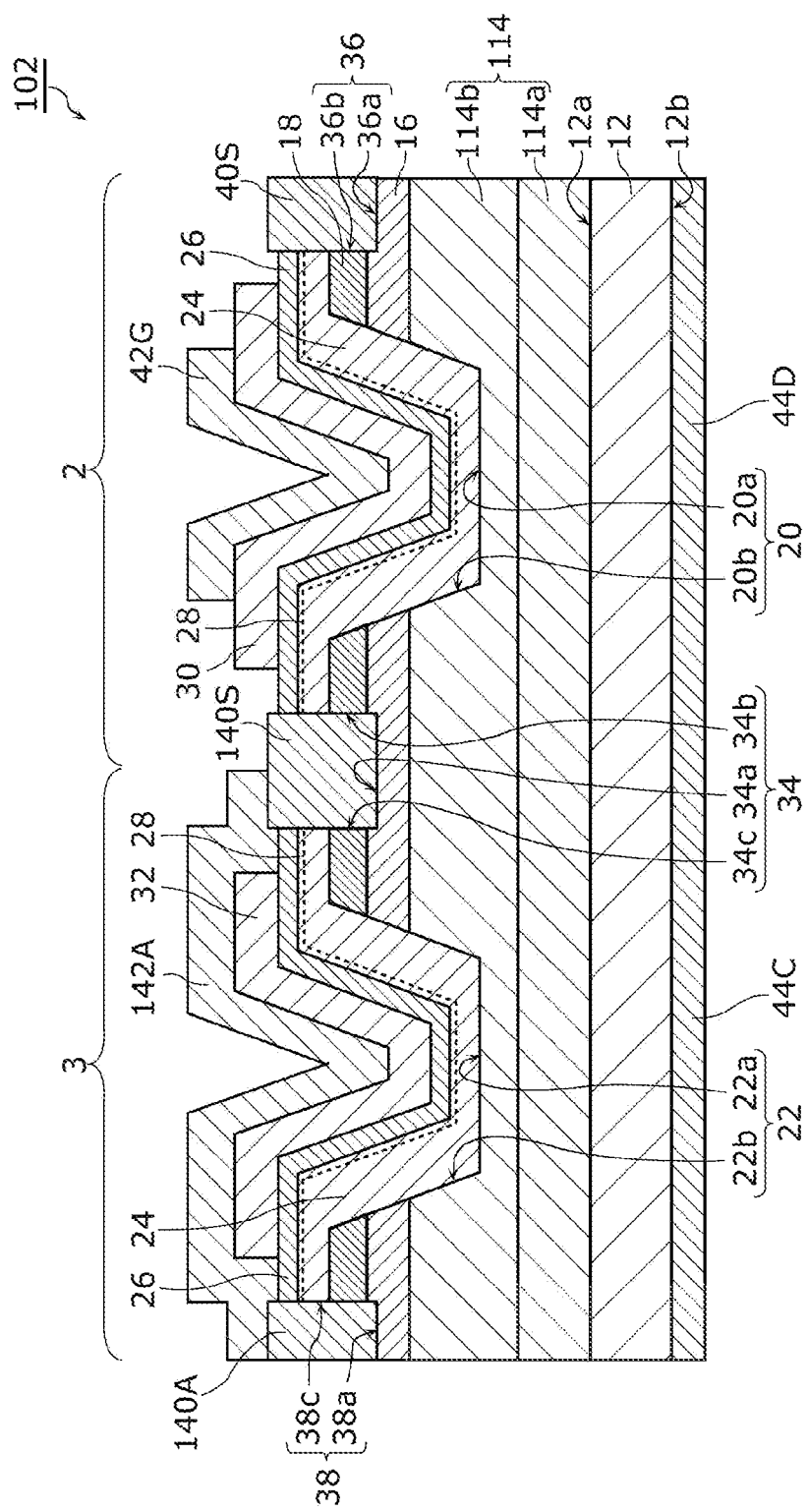
FIG. 4 is a cross-sectional view of a nitride semiconductor device according to Variation 2 of Embodiment 1.

FIG. 4 is a cross-sectional view of nitride semiconductor device 102 according to the present variation. As shown by FIG. 4, nitride semiconductor device 102 differs from nitride semiconductor device 101 according to Variation 1 in including source electrode 140S and anode electrode 142A instead of source electrode 40S and anode electrode 42A. In addition, nitride semiconductor device 102 includes electrode portion 140A.

As shown by FIG. 4, source electrode 140S covers not only bottom face 34a and side face 34b of source opening 34 but also side face 34c on the opening 22 side. In other words, source electrode 140S is connected to a portion of each of electron supply layer 26 and electron transport layer 24 on the opening 22 side, in source opening 34. Like source electrode 40S according to Embodiment 1, source electrode 140S is formed using a material in ohmic contact with an n-type semiconductor, such as Ti/Al.

Electrode portion 140A covers bottom face 38a and side face 38c of opening 38. To put it another way, electrode portion 140A is connected to a portion of each of electron supply layer 26 and electron transport layer 24 on the opening 22 side, in opening 38. Like source electrode 140S, electrode portion 140A is formed using a material in ohmic contact with an n-type semiconductor, such as Ti/Al.

In the present variation, anode electrode 142A is not in direct contact with side face 34c of source opening 34 and side face 38c of opening 38. Specifically, anode electrode 142A is electrically connected to two-dimensional electron gas 28 in electron transport layer 24 via source electrode 140S and electrode portion 140A. More specifically, anode electrode 142A is in ohmic contact with two-dimensional electron gas 28 in electron transport layer 24 via source electrode 140S and electrode portion 140A.

Accordingly, since an offset voltage is not generated in a connection portion with two-dimensional electron gas 28, it is possible to further reduce the rise voltage of vertical diode 3.

Embodiment 2

Embodiment 2 will be described next. The following descriptions will focus on the differences from Embodiment 1 and the variations thereon, and descriptions of common points will be omitted or simplified.

Figure 5:
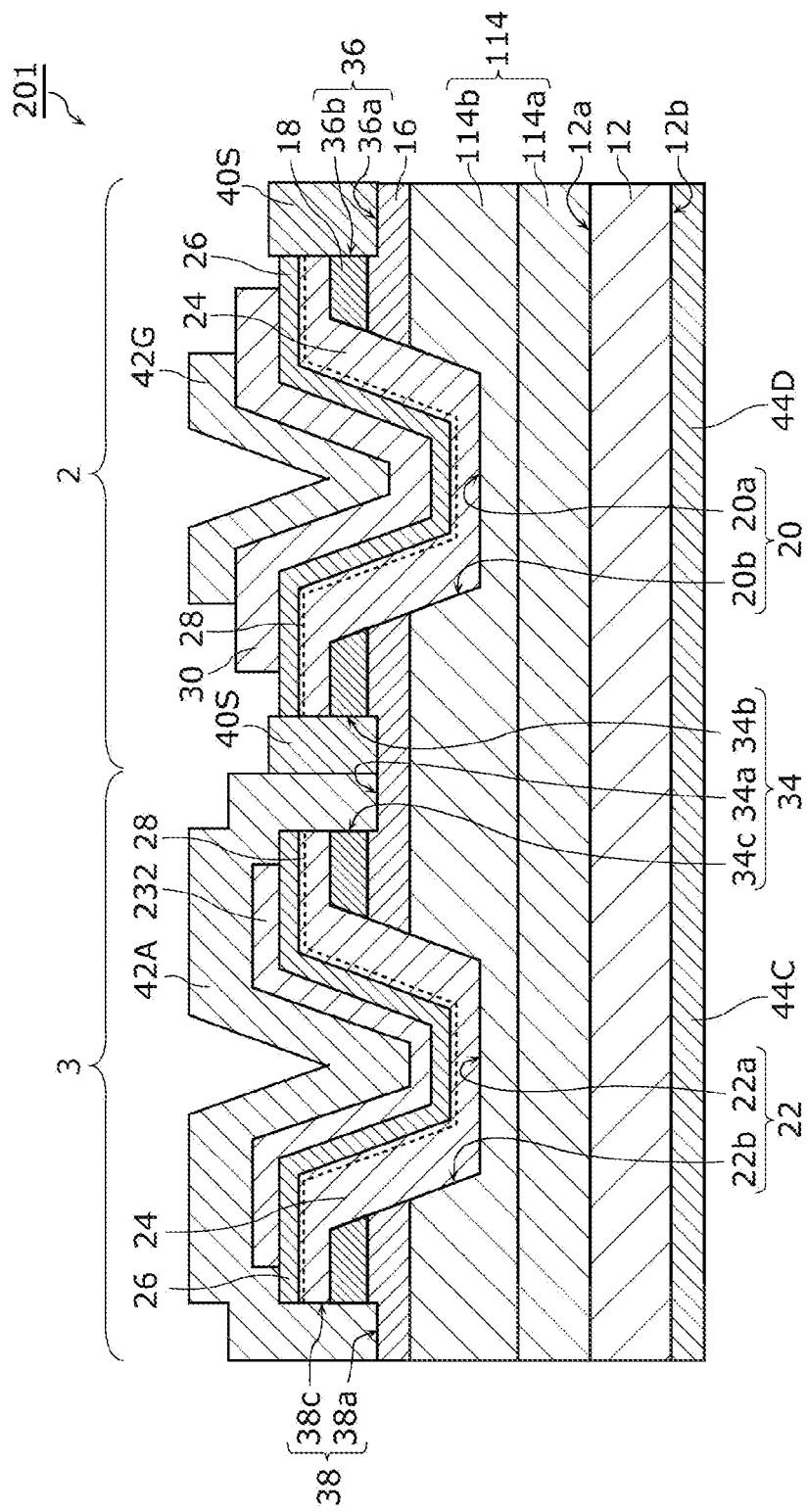
FIG. 5 is a cross-sectional view of a nitride semiconductor device according to Embodiment 2.

FIG. 5 is a cross-sectional view of nitride semiconductor device 201 according to the present embodiment. As shown by FIG. 5, nitride semiconductor device 201 differs from nitride semiconductor device 101 according to Variation 1 of Embodiment 1 in including second threshold adjustment layer 232 instead of second threshold adjustment layer 32.

Second threshold adjustment layer 232 differs from second threshold adjustment layer 32 in thickness. Specifically, the thickness of second threshold adjustment layer 232 is less than the thickness of first threshold adjustment layer 30. For example, the thickness of second threshold adjustment layer 232 is less than half the thickness of first threshold adjustment layer 30. The thickness of second threshold adjustment layer 232 may be less than ¼ of the thickness of first threshold adjustment layer 30. As an example, when the thickness of first threshold adjustment layer 30 is 200 nm, the thickness of second threshold adjustment layer 232 is 50 nm. Second threshold adjustment layer 232 is formed by, for example, first forming first threshold adjustment layer 30 and second threshold adjustment layer 32 according to Embodiment 1, and then removing only second threshold adjustment layer 32 thinly by etching.

Since the thickness of second threshold adjustment layer 232 is less than the thickness of first threshold adjustment layer 30, second threshold adjustment layer 232 makes it possible to reduce an effect of increasing the potential at the end of the conducting band of the channel part. Accordingly, it is possible to reduce a shift amount of the rise voltage of vertical diode 3 (the threshold voltage of vertical transistor 2) toward the positive side. In other words, it is possible to bring the rise voltage of vertical diode 3 much closer to 0 V.

Figure 6:
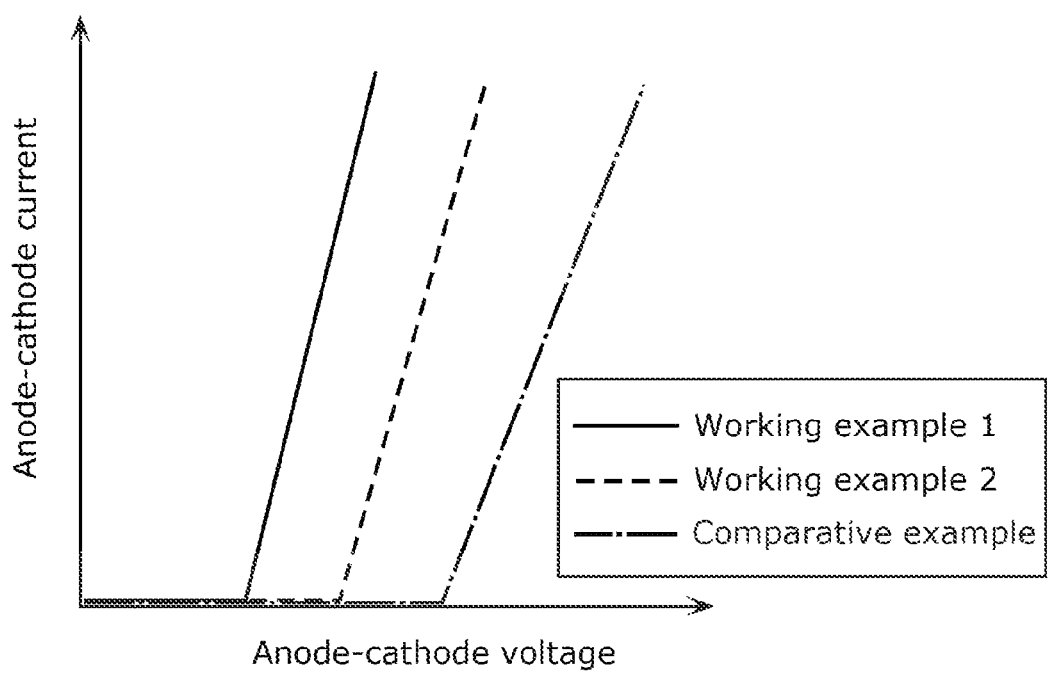
FIG. 6 is a diagram illustrating current-voltage characteristics of a vertical diode according to each of working examples and a comparative example.

FIG. 6 is a diagram illustrating current-voltage characteristics of a vertical diode according to each of working examples and a comparative example. In FIG. 6, the horizontal axis represents an anode-cathode voltage, and the vertical axis represents an anode-cathode current. In the current-voltage characteristics, a voltage at a bending point in the graph is a rise voltage.

A p-n junction diode is used in a comparative example. Vertical diode 3 according to the present embodiment is used in working example 1. Vertical diode 3 according to Variation 1 of Embodiment 1 is used in working example 2. To put it another way, working example 1 differs from working example 2 in that the thickness of second threshold adjustment layer 232 is less than the thickness of second threshold adjustment layer 32.

As shown by FIG. 6, a rise voltage in each of working example 1 and working example 2 is low, compared to the comparative example in which the p-n junction diode is used. Additionally, the rise voltage in working example 1 in which the second threshold adjustment layers of vertical diode 3 have the same thickness is lower than the rise voltage in working example 2 in which the second threshold adjustment layers of vertical diode 3 each have the different thickness.

As described above, by reducing the thickness of second threshold adjustment layer 232, it is possible to reduce the rise voltage of vertical diode 3.

[Variation]

A variation of Embodiment 2 will be described next with reference to FIG. 7. The following descriptions will focus on the differences from Embodiment 2, and descriptions of common points will be omitted or simplified.

Figure 7:
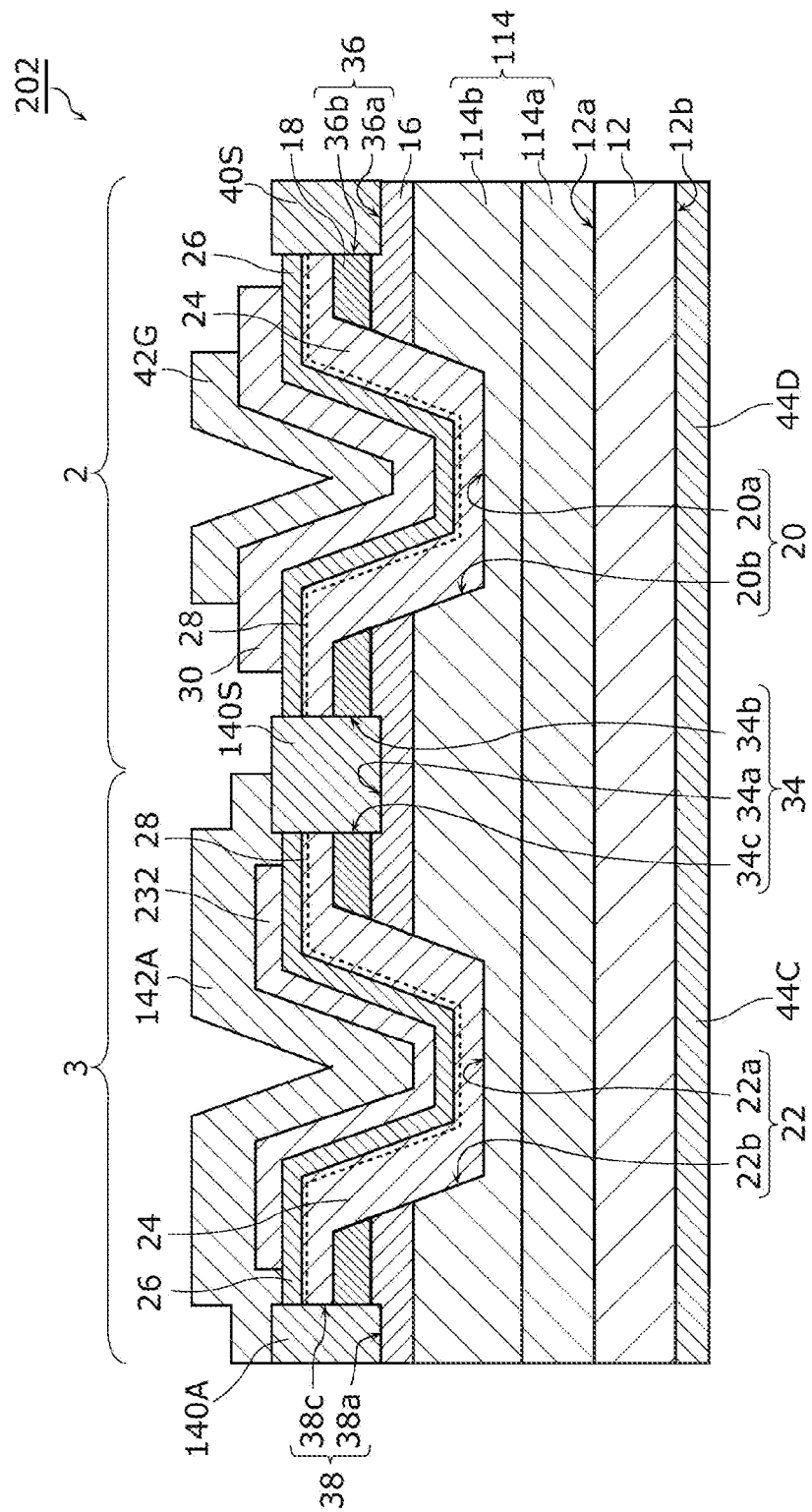
FIG. 7 is a cross-sectional view of a nitride semiconductor device according to a variation of Embodiment 2.

FIG. 7 is a cross-sectional view of nitride semiconductor device 202 according to the present variation. As shown by FIG. 7, nitride semiconductor device 202 according to the present variation differs from nitride semiconductor device 201 according to Embodiment 2 in including source electrode 140S and anode electrode 142A instead of source electrode 40S and anode electrode 42A. In addition, nitride semiconductor device 102 includes electrode portion 140A.

Source electrode 140S, anode electrode 142A, and electrode portion 140A are the same as source electrode 140S, anode electrode 142A, and electrode portion 140A according to Variation 2 of Embodiment 1.

Accordingly, as with nitride semiconductor device 102 according to Variation 2 of Embodiment 1, since the offset voltage is not generated in the connection portion with two-dimensional electron gas 28, nitride semiconductor device 202 according to the present variation makes it possible to further reduce the rise voltage of vertical diode 3.

Embodiment 3

Embodiment 3 will be described next. The following descriptions will focus on the differences from Embodiments 1 and 2 and the variations thereon, and descriptions of common points will be omitted or simplified.

Although nitride semiconductor devices 1, 101, 102, 201, and 202 each include vertical transistor 2 and vertical diode 3 in the respective embodiments and variations, nitride semiconductor devices 1, 101, 102, 201, and 202 may each include at least one of a plurality of vertical transistors 2 or a plurality of vertical diodes 3.

Figure 8:
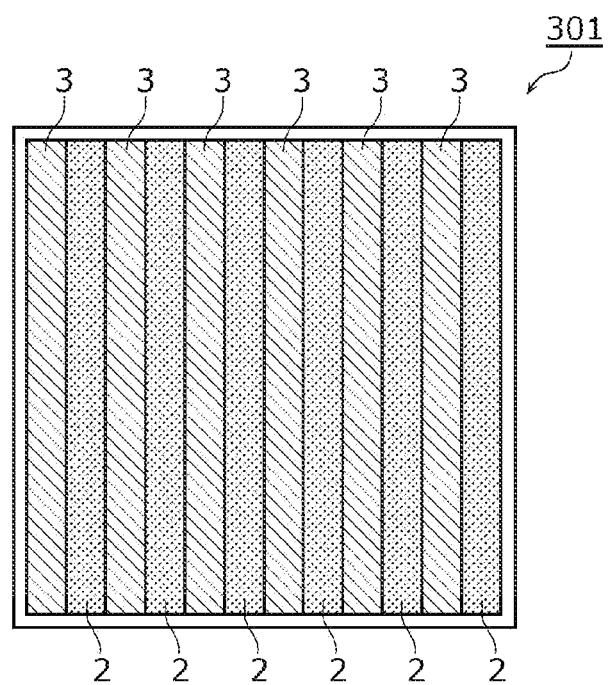
FIG. 8 is a plan view illustrating an example of a planar layout of a nitride semiconductor device according to Embodiment 3.

FIG. 8 is a plan view illustrating a planar layout of nitride semiconductor device 301 according to the present embodiment. As shown by FIG. 8, nitride semiconductor device 301 includes a plurality of vertical transistors 2 and a plurality of vertical transistors 3. The plurality of vertical transistors 2 and the plurality of vertical diodes 3 are alternately disposed in a plan view. A cross-section along the direction in which the plurality of vertical transistors 2 and the plurality of vertical diodes 3 are arranged has, for example, a shape obtained by repeatedly disposing nitride semiconductor device 1 shown by FIG. 1 horizontally multiple times. In this case, like source opening 34, opening 36 and opening 38 may be integrated into one opening.

Vertical diode 3 operates to cause a circulating current to flow when vertical transistor 2 is in the OFF-state. In other words, vertical diode 3 enters the ON-state when vertical transistor 2 is in the OFF-state. Vertical diode 3 enters the OFF-state when vertical transistor 2 is in the ON-state. As described above, the ON-state and the OFF-state of vertical transistor 2 and vertical diode 3 are mutually exclusive.

Accordingly, as shown by FIG. 8, by alternately arranging the plurality of vertical transistors 2 and the plurality of vertical diodes 3 so that the plurality of vertical diodes 3 do not concentrate in part of a chip, it is possible to suppress the concentration of the heat generated by conduction loss. For this reason, it is possible to suppress the destruction and degradation of nitride semiconductor device 301.

Figure 9:
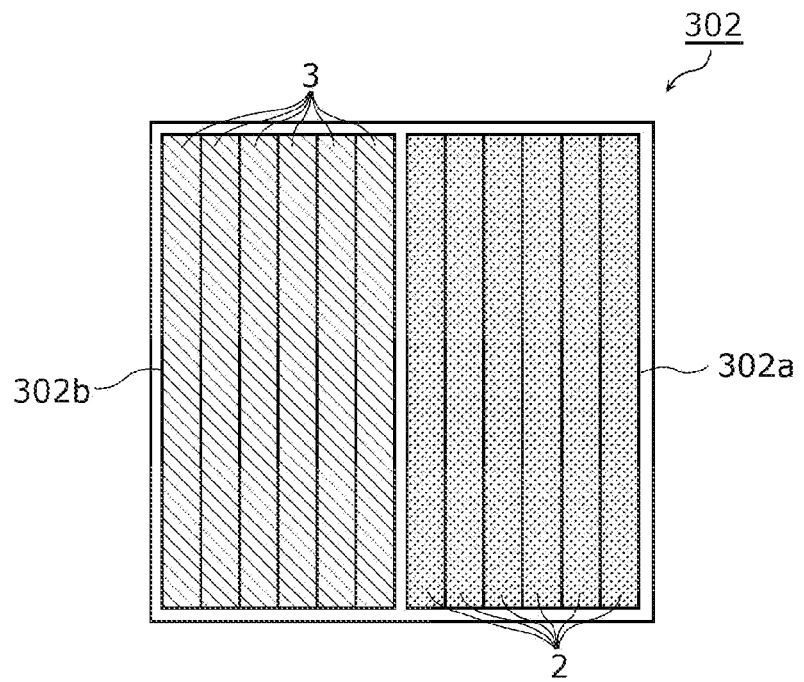
FIG. 9 is a plan view illustrating another example of a planar layout of a nitride semiconductor device according to Embodiment 3.

It should be noted that, as in nitride semiconductor device 302 shown by FIG. 9, a plurality of vertical transistors 2 and a plurality of vertical diodes 3 may be arranged in respective regions. FIG. 9 is a plan view illustrating a planar layout of nitride semiconductor device 302 according to the present embodiment.

The plurality of vertical transistors 2 are disposed adjacent to each other in first region 302a in a plan view. A cross-section along a direction in which the plurality of vertical transistors 2 are arranged has a shape obtained by, for example, repeatedly disposing vertical transistor 2 shown by FIG. 1 horizontally multiple times. In this case, source opening 34 of vertical transistor 2 is shared with opening 36 of adjacent vertical transistor 2. Stated differently, source opening 34 of vertical transistor 2 is opening 36 of adjacent vertical transistor 2, only source electrode 40S is provided, and part of anode electrode 42A is not provided.

The plurality of vertical diodes 3 are disposed adjacent to each other in second region 302b in a plan view. A cross-section along a direction in which the plurality of vertical diodes 3 are arranged has a shape obtained by, for example, repeatedly disposing vertical diode 3 shown by FIG. 1 horizontally multiple times. In this case, source opening 34 of vertical diode 3 is shared with opening 38 of adjacent vertical diode 3. Stated differently, source opening 34 of vertical diode 3 is opening 38 of adjacent vertical diode 3, only part of anode electrode 42A is provided, and source electrode 40S is not provided.

First region 302a and second region 302b are regions obtained by, for example, dividing nitride semiconductor device 302 in a plan view. First region 302a and second region 302b are equal in size but may differ in size. For example, vertical transistor 2 is required to ensure insulating properties between gate electrode 42G and source electrode 40S, whereas vertical diode 3 is not required. As a result, the width of vertical diode 3 can be made less than the width of vertical transistor 2. Accordingly, second region 302b in which the plurality of vertical diodes 3 are disposed can be made smaller than first region 302a.

In the example shown by FIG. 9, anode electrode 42A and source electrode 40S are electrically connected via an electrode pad not shown. Alternatively, like source opening 34 shown by FIG. 1, anode electrode 42A and source electrode 40S may be directly connected at the boundary between first region 302a and second region 302b.

As described above, in each of the examples shown by FIG. 8 and FIG. 9, it is possible to achieve the integration of the plurality of vertical transistors 2 and the plurality of vertical diodes 3. As a result, it is possible to provide compact nitride semiconductor devices 301 and 302 having a high breakdown voltage and a low loss.

It should be noted that the plurality of vertical transistors 2 and the plurality of vertical diodes 3 are equal in number but may differ in number. Moreover, for example, two or more of the plurality of vertical transistors 2 and two or more of the plurality of vertical diodes 3 may be alternately disposed.

Other Embodiments

Although one or more aspects of a nitride semiconductor device have been described thus far on the basis of embodiments, the present disclosure is not intended to be limited to these embodiments. Variations on the present embodiment conceived by one skilled in the art and embodiments implemented by combining constituent elements from different other embodiments, for as long as they do not depart from the essential spirit thereof, fall within the scope of the present disclosure.

For example, the nitride semiconductor device according to each of the aforementioned embodiments need not include at least one of the first threshold adjustment layer or the second threshold adjustment layer. For example, gate electrode 42G may be provided on a top face of electron supply layer 26. Anode electrode 42A may be provided on the top face of electron supply layer 26.

Moreover, for example, when the influence of the parasitic bipolar transistor formed by electron transport layer 24, blocking layer 16, and drift layer 14 is sufficiently low, the nitride semiconductor device need not include high-resistance layer 18.

Furthermore, for example, drift layer 14 and blocking layer 16 may be separated between vertical transistor 2 and vertical diode 3.

In addition, for example, the first conductivity type may be p-type, $p^+$-type, or $p^-$-type, and the second conductivity type may be n-type, n+-type, or $n^-$-type.

Additionally, many changes, substitutions, additions, omissions, and the like are possible for the foregoing embodiments without departing from the scope of the claims or a scope equivalent thereto.

INDUSTRIAL APPLICABILITY

The nitride semiconductor device according to the present disclosure can be used, for example, as a power device such as a power transistor or the like employed in power circuitry of consumer devices such as televisions.

The invention claimed is:

1. A nitride semiconductor device including a vertical transistor and a vertical diode, the nitride semiconductor device comprising:
   a substrate;
   a first nitride semiconductor layer of a first conductivity type above the substrate;
   a second nitride semiconductor layer of a second conductivity type above the first nitride semiconductor layer, the second conductivity type being different from the first conductivity type;
   a first opening penetrating through the second nitride semiconductor layer to the first nitride semiconductor layer;
   a second opening provided away from the first opening and penetrating through the second nitride semiconductor layer to the first nitride semiconductor layer;
   an electron transport layer and an electron supply layer provided, in stated order from a substrate side, along an inner face of each of the first opening and the second opening and above the second nitride semiconductor layer;
   a gate electrode of the vertical transistor above the electron supply layer and covering the first opening;
   an anode electrode of the vertical diode above the electron supply layer and covering the second opening;
   a third opening provided between the first opening and the second opening in a plan view and penetrating through the electron supply layer and the electron transport layer to the second nitride semiconductor layer;
   a source electrode of the vertical transistor connected to the second nitride semiconductor layer and a portion of each of the electron supply layer and the electron transport layer on a first opening side, in the third opening;
   a drain electrode of the vertical transistor provided on a side of the substrate facing away from the first nitride semiconductor layer, at a position where the drain electrode overlaps the gate electrode in a plan view; and
   a cathode electrode of the vertical diode on the side of the substrate facing away from the first nitride semiconductor layer, at a position where the cathode electrode overlaps the anode electrode in a plan view,
   wherein the anode electrode and the source electrode are electrically connected, and
   the cathode electrode and the drain electrode are electrically connected.

2. The nitride semiconductor device according to claim 1, further comprising:
   a first threshold adjustment layer between the gate electrode and the electron supply layer; and
   a second threshold adjustment layer between the anode electrode and the electron supply layer.

3. The nitride semiconductor device according to claim 2, wherein the first threshold adjustment layer and the second threshold adjustment layer are each a nitride semiconductor layer of the second conductivity type.

4. The nitride semiconductor device according to claim 2, wherein the second threshold adjustment layer has a thickness less than a thickness of the first threshold adjustment layer.

5. The nitride semiconductor device according to claim 1, wherein the anode electrode is connected to a portion of each of the electron supply layer and the electron transport layer on a second opening side, in the third opening.

6. The nitride semiconductor device according to claim 1, wherein the source electrode is further connected to a portion of each of the electron supply layer and the electron transport layer on a second opening side, in the third opening.

7. The nitride semiconductor device according to claim 1, comprising:
   a plurality of vertical transistors each of which is the vertical transistor, and a plurality of vertical diodes each of which is the vertical diode,
   wherein the plurality of vertical transistors and the plurality of vertical diodes are alternately disposed in a plan view.

8. The nitride semiconductor device according to claim 1, comprising:
   a plurality of vertical transistors each of which is the vertical transistor, and a plurality of vertical diodes each of which is the vertical diode,
   wherein the plurality of vertical transistors are disposed adjacent to each other in a first region in a plan view, and
   the plurality of vertical diodes are disposed adjacent to each other in a second region in a plan view, the second region being different from the first region.

* * * * *